US012216382B1

United States Patent
Marquez

(10) Patent No.: US 12,216,382 B1
(45) Date of Patent: Feb. 4, 2025

(54) PROCESSOR CIRCUIT FOR GENERATING ULTRAFAST CLOCK MULTIPLIER

(71) Applicant: Milkshake Technology Inc., Menlo Park, CA (US)

(72) Inventor: Bicky A. Marquez, Kingston (CA)

(73) Assignee: Milkshake Technology Inc., Menlo Park, CA (US)

( * ) Notice: Subject to any disclaimer, the term of this patent is extended or adjusted under 35 U.S.C. 154(b) by 0 days.

(21) Appl. No.: 18/410,910

(22) Filed: Jan. 11, 2024

(51) Int. Cl.
*G02F 3/02* (2006.01)
*G02B 6/12* (2006.01)
*G02F 1/01* (2006.01)
*G06F 1/04* (2006.01)
*H01S 3/00* (2006.01)
*H03K 3/86* (2006.01)

(52) U.S. Cl.
CPC .......... *G02F 3/028* (2013.01); *G02B 6/12004* (2013.01); *G02F 1/0126* (2013.01); *G06F 1/04* (2013.01); *H01S 3/0057* (2013.01); *H03K 3/86* (2013.01)

(58) Field of Classification Search
CPC ... G02F 3/028; G02F 1/0126; G02B 6/12004; G06F 1/04; H01S 3/0057; H03K 3/86
See application file for complete search history.

(56) References Cited

U.S. PATENT DOCUMENTS

2022/0247077 A1\* 8/2022 Bhagavatula .......... H01Q 5/307

\* cited by examiner

*Primary Examiner* — Thanh Luu
*Assistant Examiner* — Monica T Taba
(74) *Attorney, Agent, or Firm* — Fenwick & West LLP

(57) ABSTRACT

A photonic circuit for generating an ultrafast clock for a photonic processor. The photonic circuit includes a beam splitter, a phase shifter, a first photonic combiner coupled to the beam splitter and the phase shifter, and a second photonic combiner coupled to the beam splitter and the first photonic combiner. The beam splitter splits a received photonic seed clock signal into a first photonic seed clock signal and a second photonic seed clock signal. The phase shifter shifts a phase of a received photonic signal to generate a phase-shifted version of the photonic signal. The first photonic combiner combines the second photonic seed clock signal with the phase-shifted version of the photonic signal to generate a first combined photonic signal. The second photonic combiner combines a delayed and attenuated version of the first photonic seed clock signal with the first combined photonic signal to generate a photonic clock signal.

20 Claims, 6 Drawing Sheets

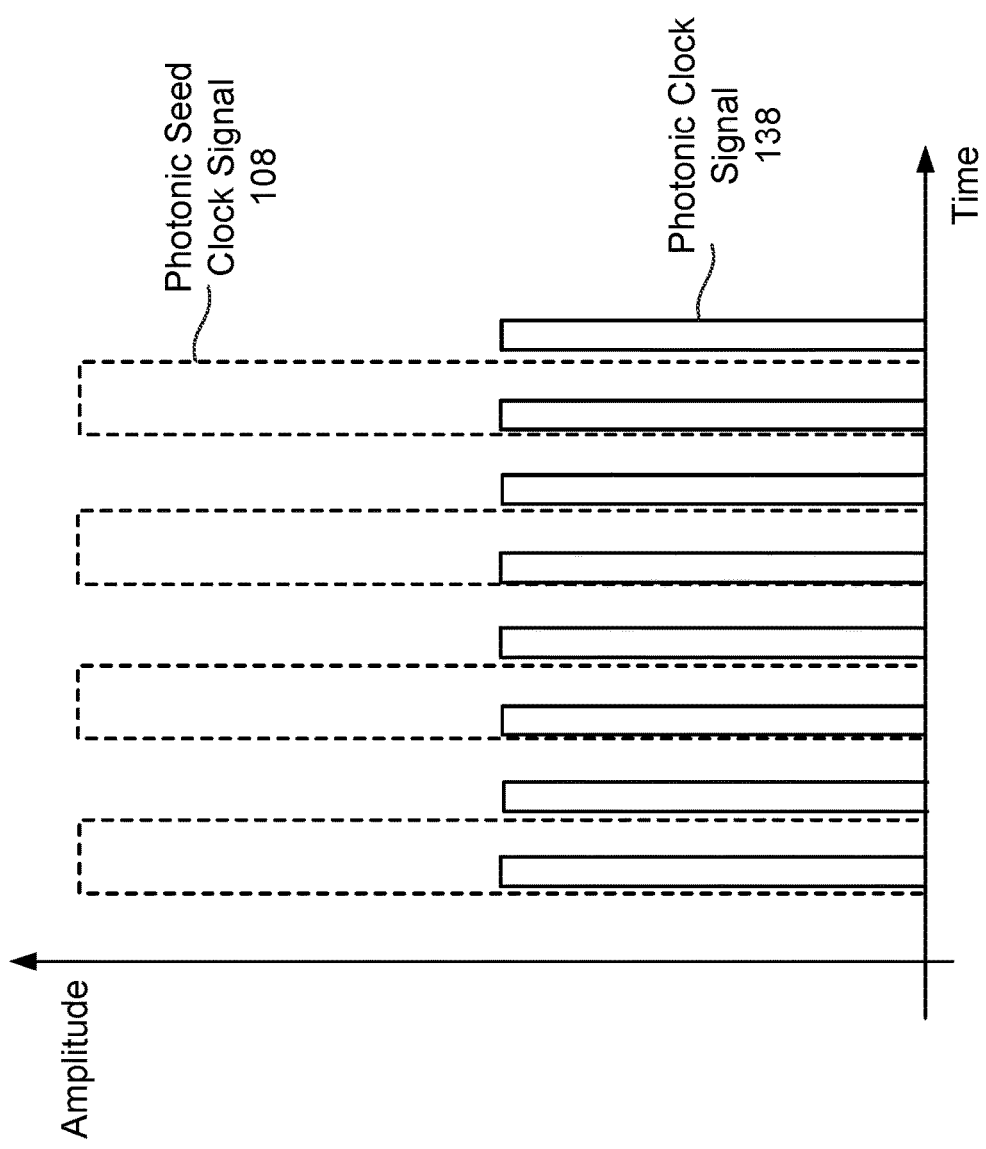

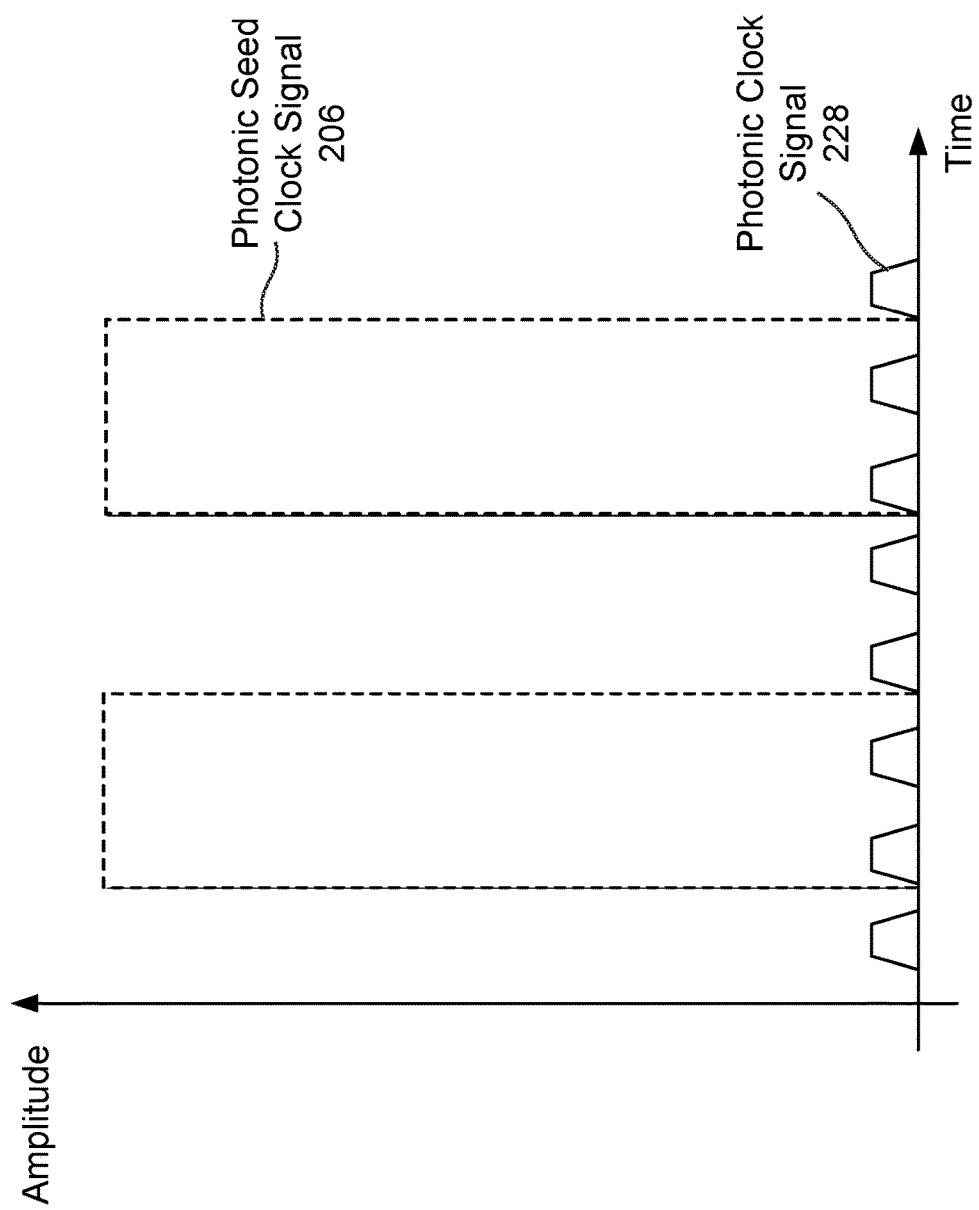

400

```
┌─────────────────────────────────────────────────────┐
│ Split, by a beam splitter of a photonic circuit, a  │
│ photonic seed clock signal into a first photonic    │
│ seed clock signal and a second photonic seed        │
│ clock signal                                         │
│ 405                                                  │
└─────────────────────────────────────────────────────┘
                         ↓
┌─────────────────────────────────────────────────────┐
│ Shift, by a phase shifter of the photonic circuit,  │
│ a phase of a photonic signal to generate a          │
│ phase-shifted version of the photonic signal        │
│ 410                                                  │
└─────────────────────────────────────────────────────┘
                         ↓
┌─────────────────────────────────────────────────────┐
│ Combine, by a first photonic combiner of the        │
│ photonic circuit coupled to the beam splitter and   │
│ the phase shifter, the second photonic seed clock   │
│ signal with the phase-shifted version of the        │
│ photonic signal to generate a first combined        │
│ photonic signal                                      │
│ 415                                                  │
└─────────────────────────────────────────────────────┘
                         ↓
┌─────────────────────────────────────────────────────┐
│ Combine, by a second photonic combiner of the       │
│ photonic circuit coupled to the beam splitter and   │
│ the first photonic combiner, a delayed and          │
│ attenuated version of the first photonic seed clock │
│ signal with the first combined photonic signal to   │
│ generate a photonic clock signal                     │
│ 420                                                  │
└─────────────────────────────────────────────────────┘
```

*FIG. 4*

PROCESSOR CIRCUIT FOR GENERATING ULTRAFAST CLOCK MULTIPLIER

TECHNICAL FIELD

The present disclosure generally relates to a processor architecture and, more specifically, to a processor circuit for generating an ultrafast clock multiplier for, e.g., photonic processors.

BACKGROUND

Photonic hardware is favorable for applications requiring high bandwidth, low latency, and low switching energy for signal processing, data communications, and information processing (i.e., computing). Recent innovations in silicon photonic fabrication have enabled the on-chip implementation of photonic circuits. This has opened a low-cost, high-precision, and scalable avenue for the development of photonic computing. Advances in photonic computing have demonstrated suitability for applications requiring high-bandwidth parallel processing, especially neural networks, offering higher speed and less energy consumption than equivalent networks implemented in digital or analog electronics. However, to support even high processing speeds for future advances in photonic computing, photonic processors would require substantially higher clock rates than what is typically used nowadays.

SUMMARY

Embodiments of the present disclosure are directed to the implementation of a photonic circuit for generating an ultrafast clock multiplier for, e.g., a photonic processor. The photonic circuit presented herein comprises a beam splitter, a phase shifter, a first photonic combiner coupled to a first output of the beam splitter and an output of the phase shifter, and a second photonic combiner coupled to a second output of the beam splitter and an output of the first photonic combiner. The beam splitter includes at least one input to receive a photonic seed clock signal, and the beam splitter is configured to split the photonic seed clock signal into a first photonic seed clock signal and a second photonic seed clock signal. The phase shifter includes at least one input to receive a photonic signal, and the phase shifter is configured to shift a phase of the received photonic signal to generate a phase-shifted version of the photonic signal. The first photonic combiner includes a first set of one or more inputs, a first input of the first set of one or more inputs is coupled to a first output of the beam splitter, and a second input of the first set of one or more inputs is coupled to an output of the phase shifter. The first photonic combiner is configured to combine the second photonic seed clock signal with the phase-shifted version of the photonic signal to generate a first combined photonic signal. The second photonic combiner includes a second set of one or more inputs, a first input of the second set of one or more inputs is coupled to a second output of the beam splitter, and a second input of the second set of one or more inputs is coupled to an output of the first photonic combiner. The second photonic combiner is configured to combine a delayed and attenuated version of the first photonic seed clock signal with the first combined photonic signal to generate a photonic clock signal.

Embodiments of the present disclosure are further directed to a non-transitory computer-readable storage medium comprising stored instructions that, when executed by at least one processor, cause the at least one processor to: instruct a beam splitter of a photonic circuit to receive a photonic seed clock signal and split the photonic seed clock signal into a first photonic seed clock signal and a second photonic seed clock signal; instruct a phase shifter of the photonic circuit to receive a photonic signal and shift a phase of the photonic signal to generate a phase-shifted version of the photonic signal; instruct a first photonic combiner of the photonic circuit coupled to the beam splitter and the phase shifter to combine the second photonic seed clock signal with the phase-shifted version of the photonic signal to generate a first combined photonic signal; and instruct a second photonic combiner of the photonic circuit coupled to the beam splitter and the first photonic combiner to combine a delayed and attenuated version of the first photonic seed clock signal with the first combined photonic signal to generate a photonic clock signal. The non-transitory computer-readable storage medium can be a digital storage medium, an analog storage medium, an optical storage medium, some other type of storage medium, or some combination thereof. The at least one processor can be an optical processor, an electronic processor (e.g., central processing unit (CPU) processor, machine learning (ML) processor, graphics processing unit (GPU) processor), some other type of processor, or some combination thereof.

Embodiments of the present disclosure are further directed to a method for operating a photonic circuit that generates an ultrafast clock multiplier for a photonic processor. The method comprises: splitting, by a beam splitter of a photonic circuit, a photonic seed clock signal into a first photonic seed clock signal and a second photonic seed clock signal; shifting, by a phase shifter of the photonic circuit, a phase of a photonic signal to generate a phase-shifted version of the photonic signal; combining, by a first photonic combiner of the photonic circuit coupled to the beam splitter and the phase shifter, the second photonic seed clock signal with the phase-shifted version of the photonic signal to generate a first combined photonic signal; and combining, by a second photonic combiner of the photonic circuit coupled to the beam splitter and the first photonic combiner, a delayed and attenuated version of the first photonic seed clock signal with the first combined photonic signal to generate a photonic clock signal.

BRIEF DESCRIPTION OF THE DRAWINGS

FIG. 1B illustrates an example graph of a photonic seed clock signal and the first photonic ultrafast clock signal that is generated by the photonic system in FIG. 1A, in accordance with some embodiments.

FIG. 2B illustrates an example graph of a photonic seed clock signal and the second photonic ultrafast clock signal that is generated by the photonic system in FIG. 2A, in accordance with some embodiments.

FIG. 4 is a flowchart illustrating an example method for operating a photonic circuit to generate a photonic ultrafast clock signal, in accordance with some embodiments.

The figures depict embodiments of the present disclosure for purposes of illustration only. One skilled in the art will readily recognize from the following description that alternative embodiments of the structures and methods illustrated herein can be employed without departing from the principles or benefits touted by the disclosure described herein.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that can be employed without departing from the principles of what is claimed.

Reference will now be made in detail to several embodiments, examples of which are illustrated in the accompanying figures. It is noted that wherever practicable, similar or like reference numbers can be used in the figures and can indicate similar or like functionality. The figures depict embodiments of the disclosed system (or method) for illustration only. One skilled in the art will readily recognize from the following description that alternative embodiments of the structures and methods illustrated herein can be employed without departing from the principles described herein.

Embodiments of the present disclosure are directed to the implementation of a photonic circuit that generates a photonic ultrafast clock signal for use in, e.g., photonic processors. The photonic circuit may include a photonic bit rate multiplier that is applied to a photonic seed clock signal to generate a photonic ultrafast clock signal. The photonic seed clock signal may be input into a photonic modulator that is coupled to the photonic bit rate multiplier. The photonic bit rate multiplier may be implemented by utilizing a phase shifter, a photonic attenuator, a beam splitter, photonic combiners, a cascaded connection of delay circuits and phase shifters, inverse-designed elements, semiconductor optical amplifiers, or any other optical or electro-optical element that contributes to improving the design of photonic bit rate multiplier. In some embodiments, one or more photonic amplifiers are applied within the photonic bit rate multiplier so that amplitudes of the photonic ultrafast clock signal are at one or more desired levels.

Photonic Circuits with Bit Rate Multipliers for Ultrafast Clock Generation

Figure 1A:
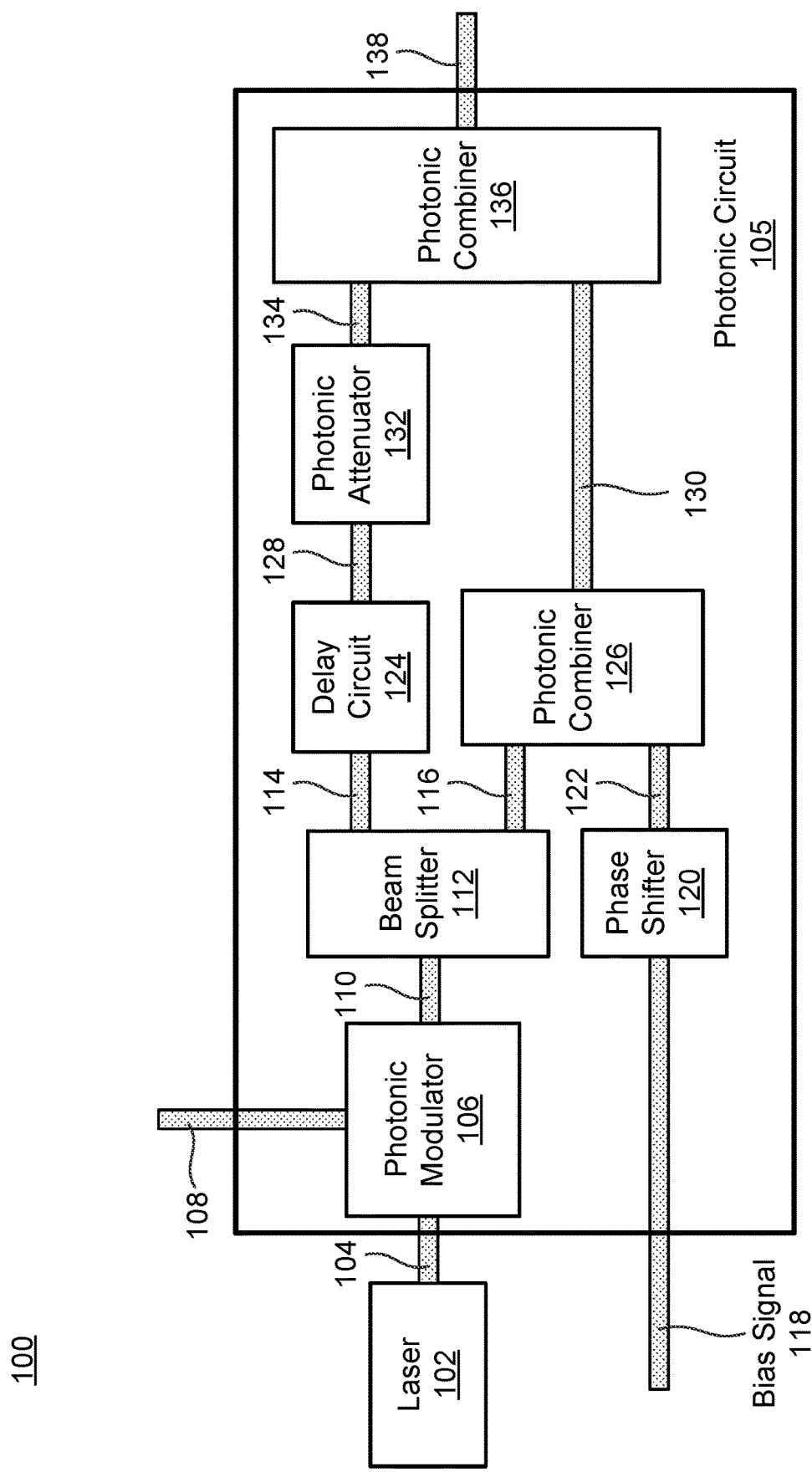
FIG. 1A illustrates an example photonic system for generating a first photonic ultrafast clock signal, in accordance with some embodiments.

FIG. 1A illustrates an example photonic system 100 with a photonic circuit 105 for generating a photonic ultrafast clock signal, in accordance with some embodiments. In addition to the photonic circuit 105, the photonic system 100 may include a laser 102 coupled to an input port of the photonic circuit 105. The photonic circuit 105 may generate a photonic clock signal 138 (e.g., via a photonic clock signal line) using a photonic seed clock signal 108 (e.g., via a photonic seed clock signal line), wherein a rate of the photonic clock signal 138 is faster (e.g., approximately two times) than a rate of the photonic seed clock signal 108. The photonic circuit 105 may include a photonic modulator 106 having an input port coupled to the laser 102 and a beam splitter 112 having an input port coupled to an output port of the photonic modulator 106. The photonic circuit 105 also may include a phase shifter 120 that includes an input port coupled with a signal line to a bias signal source. An output of the phase shifter 120 couples with a second input of a photonic combiner 126, and a first output port of the beam splitter 112 couples with a first input of a photonic combiner 126. A second output port of the beam splitter 112 couples with an input port of the delay circuit 124. An output port of the delay circuit 124 couples with an input port of the photonic attenuator 132. An output port of the photonic attenuator 132 couples with a first input port of a photonic combiner 136 and an output port of the photonic combiner 126 couples with a second input port of the photonic combiner 136. An output port of the photonic combiner 136 provides an output of the photonic circuit 105 (i.e., the photonic clock signal 138). It is noted that the input/output ports may be coupled through signal transmission lines (or signal lines). The photonic circuit 105 may include fewer or additional components not shown in FIG. 1A, such as, but not limited to, additional phase shifters for compensation of fabrication variations, linear photonic amplifiers, photonic attenuators, inverse-designed photonic elements, photonic phase thresholders, and/or photonic amplitude thresholders.

The laser 102 may generate and emit a photonic signal 104 of one or more wavelengths (or modes). The laser 102 may include one or more laser emitters, each laser emitter being configured to generate and emit the photonic signal 104 of a respective wavelength. The one or more laser emitters of the laser 102 may be instructed (i.e., triggered) by at least one processor (e.g., optical processor, electronic processor, electro-optical processor, etc.) coupled to the one or more laser emitters to generate the photonic signal 104 of one or more specific wavelengths. The photonic signal 104 generated by the laser 102 may be provided for modulation to a first input port of the photonic modulator 106. At the same time, the photonic seed clock signal 108 may be provided to a second input port of the photonic modulator 106. The photonic seed clock signal 108 may be a periodic light signal that includes a plurality of light pulses having a period $t=B^{-1}$, where B is a rate (or frequency) of the plurality of light pulses in the photonic seed clock signal 108. The photonic seed clock signal 108 may be generated by one or more photonic components of the photonic system 100 (e.g., pattern generator, local oscillator, etc. not shown in FIG. 1A).

The set of input ports of the photonic modulator 106 may represent, e.g., a set of waveguides, a set of waveguide polarizations, a set of waveguide modes, a set of light wavelengths, etc. The set of input ports of the photonic modulator 106 may also represent input ports of the photonic circuit 105. The photonic modulator 106 may modulate the photonic seed clock signal 108 using the photonic signal 104 to generate a modulated photonic seed clock signal 110. The modulated photonic seed clock signal 110 may feature the period t of the photonic seed clock signal 108 and the one or more wavelengths of the photonic signal 104. The modulated photonic seed clock signal 110 may be output at an output port of the photonic modulator 106. The output port of the photonic modulator 106 may represent, e.g., a waveguide, a waveguide polarization, a waveguide mode, a light wavelength, a signal radiated by the photonic modulator 106, etc. The modulated photonic seed clock signal 110 generated by the photonic modulator 106 may be passed to the beam splitter.

The beam splitter 112 may receive the modulated photonic seed clock signal 110 at its input port. The input port of the beam splitter 112 may represent, e.g., a waveguide, a waveguide polarization, a waveguide mode, a light wavelength, etc. The beam splitter 112 is a linear photonic component that splits the modulated photonic seed clock signal 110 into two photonic seed clock signals 114 and 116. Each photonic seed clock signal 114 and 116 may be output at a respective output port of the beam splitter 112. A set of output ports of the beam splitter 112 may represent, e.g., a set of waveguides, a set of waveguide polarizations, a set of waveguide modes, a set of light wavelengths, signals radiated by the beam splitter 112, etc. The photonic seed clock signals 114 and 116 produced by the beam splitter 112 may be passed to the delay circuit 124 and the photonic combiner 126, respectively.

The phase shifter 120 may receive a bias signal 118 at an input port of the phase shifter 120. The input port of the phase shifter 120 may represent, e.g., a waveguide, a waveguide polarization, a waveguide mode, a light wavelength, etc. The input port of the phase shifter 120 may also represent an input port of the photonic circuit 105. The bias signal 118 that is input to the phase shifter 120 is a light signal of a defined amplitude level that is constant over time. The bias signal 118 may be generated by, e.g., a photonic local oscillator or constant source coupled to the input port of the phase shifter 120 (not shown in FIG. 1A). The phase shifter 120 is a linear photonic component that generates a photonic signal 122 by shifting a phase of the received bias signal 118. For example, the phase shifter 120 may apply a phase shift of $\pi$ radians to the bias signal 118, i.e., the photonic signal 122 may represent an inverted version of the bias signal 118. The photonic signal 122 may be output at an output port of the phase shifter 120. The output port of the phase shifter 120 may represent, e.g., a waveguide, a waveguide polarization, a waveguide mode, a light wavelength, a signal radiated by the phase shifter 120, etc. The photonic signal 122 generated by the phase shifter 120 may be passed to the photonic combiner 126.

The delay circuit 124 may receive the photonic seed clock signal 114 at an input port of the delay circuit 124. The input port of the delay circuit 124 may represent, e.g., a waveguide, a waveguide polarization, a waveguide mode, a light wavelength, etc. The delay circuit 124 is a linear photonic component that generates a photonic seed clock signal 128 by delaying the photonic seed clock signal 114 by a defined time period (e.g., by $\tau/2$). In one or more embodiments, the delay circuit 124 is implemented as, e.g., a long waveguide, long optical fiber, slow-light material, or photonic D-type flip-flop. The photonic seed clock signal 128 may be output at an output port of the delay circuit 124. The output port of the delay circuit 124 may represent, e.g., a waveguide, a waveguide polarization, a waveguide mode, a light wavelength, a signal radiated by the delay circuit 124, etc. The photonic seed clock signal 128 generated by the delay circuit 124 may be passed to the photonic attenuator 132.

The photonic combiner 126 may receive, at its first input port, the photonic seed clock signal 116 generated by the beam splitter 112. The photonic combiner 126 may further receive, at its second input port, the photonic signal 122 generated by the phase shifter 120. The set of input ports of the photonic combiner 126 may represent, e.g., a set of waveguides, a set of waveguide polarizations, a set of waveguide modes, a set of light wavelengths, etc. The photonic combiner 126 may generate a photonic seed clock signal 130 by combining the photonic seed clock signal 116 and the photonic signal 122. Thus, the photonic combiner 126 operates as a linear OR photonic logic gate. Note that the phase shifter 120 and the photonic combiner 126 may effectively subtract the bias signal 118 from the photonic seed clock signal 116 to generate the photonic seed clock signal 130. The photonic seed clock signal 130 may be output at an output port of the photonic combiner 126. The output port of the photonic combiner 126 may represent, e.g., a waveguide, a waveguide polarization, a waveguide mode, a light wavelength, a signal radiated by the photonic combiner 126, etc. The photonic seed clock signal 130 generated by the photonic combiner 126 may be passed to the photonic combiner 136.

The photonic attenuator 132 may receive the photonic seed clock signal 128 (i.e., delayed version of the photonic seed clock signal 114) at its input port. The input port of the photonic attenuator 132 may represent, e.g., a waveguide, a waveguide polarization, a waveguide mode, a light wavelength, etc. The photonic attenuator 132 is a linear photonic component that generates a photonic seed clock signal 134 by attenuating the photonic seed clock signal 128 by a configurable attenuation amount. The photonic seed clock signal 134 may be output at an output port of the photonic attenuator 132. The output port of the photonic attenuator 132 may represent, e.g., a waveguide, a waveguide polarization, a waveguide mode, a light wavelength, a signal radiated by the photonic attenuator 132, etc. The photonic attenuator 132 may pass the photonic seed clock signal 134 to the photonic combiner 136.

The photonic combiner 136 may receive, at its first input port, the photonic seed clock signal 134 generated by the photonic attenuator 132. The photonic combiner 136 may further receive, at its second input port, the photonic seed clock signal 130 generated by the photonic combiner 126. The set of input ports of the photonic combiner 136 may represent, e.g., a set of waveguides, a set of waveguide polarizations, a set of waveguide modes, a set of light wavelengths, etc. The photonic combiner 136 may generate the photonic clock signal 138 by combining the photonic seed clock signal 134 and the photonic seed clock signal 130. Thus, the photonic combiner 136 operates as a linear OR photonic logic gate. The photonic clock signal 138 may be output at an output port of the photonic combiner 136. The output port of the photonic combiner 136 may represent, e.g., a waveguide, a waveguide polarization, a waveguide mode, a light wavelength, a signal radiated by the photonic combiner 136, etc. The output port of the photonic combiner 136 may represent an output port of the photonic circuit 105.

FIG. 1B illustrates an example graph 150 of the photonic seed clock signal 108 that is input to the photonic circuit 105 and the photonic clock signal 138 that is generated by the photonic circuit 105, in accordance with some embodiments. Note that a rate of the photonic clock signal 138 is faster (e.g., approximately two times faster) than a rate of the photonic seed clock signal 108 that is input to the photonic circuit 105. For example, the rate of the photonic seed clock signal 108 may be approximately 50 Gbps, and the rate of the photonic clock signal 138 may be approximately 100 Gbps. Thus, the photonic circuit 105 may effectively operate as a photonic bit rate multiplier. Note also that the photonic clock signal 138 may feature the one or more wavelengths originating from the photonic signal 104 generated by the laser 102. In one or more embodiments, the photonic circuit 105 includes one or more photonic linear amplifiers for generating the photonic clock signal 138 having amplitudes of one or more desired levels. The photonic circuit 105 with the one or more photonic amplifiers may be configured to generate the photonic clock signal 138 having a signal-to-noise ratio that is above a threshold level. The photonic clock signal 138 generated by the photonic circuit 105 may be provided as a clock signal to one or more photonic circuits of a photonic processor.

In one or more embodiments, in order to provide the photonic clock signal 138 to the one or more photonic circuits, a photonic phase thresholder (and/or photonic amplitude thresholder) is required to correct phases and/or amplitude values of the photonic clock signal 138. Each of the photonic phase thresholder and the photonic amplitude thresholder may be based on a semiconductor optical amplifier operating in the saturation regime. Alternatively, an electro-optical thresholder may be utilized for correcting phases and/or amplitude values of the photonic clock signal 138. The electro-optical thresholder may be designed by cascading photodetectors, transimpedance amplifiers, drivers, and photonic modulators. Alternatively, other types of thresholders can be used for correcting phases and/or amplitude values of the photonic clock signal 138.

Figure 2A:
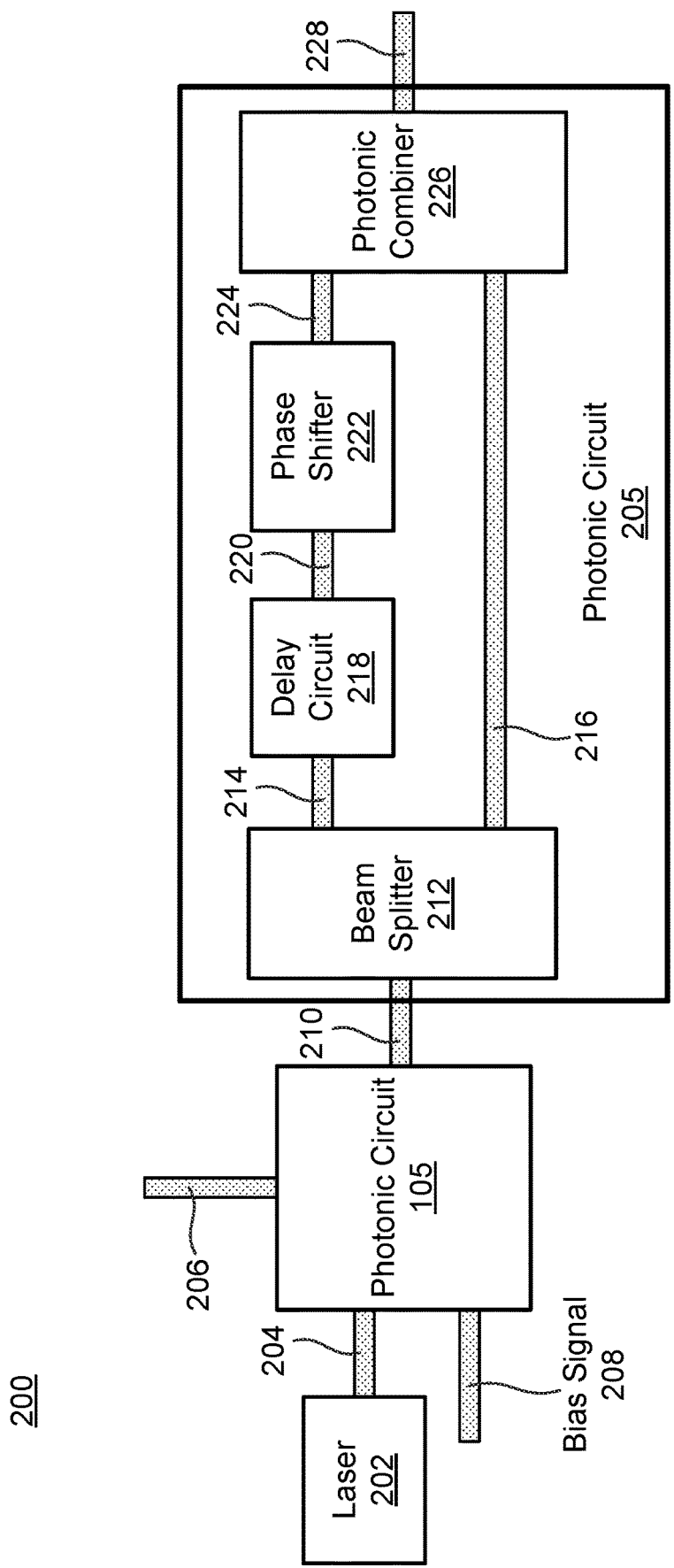
FIG. 2A illustrates an example photonic system for generating a second photonic ultrafast clock signal, in accordance with some embodiments.

FIG. 2A illustrates an example photonic system 200 with the photonic circuit 105 coupled to a photonic circuit 205 for generating a photonic ultrafast clock signal, in accordance with some embodiments. In addition to the photonic circuit 105 and the photonic circuit 205, the photonic system 100 may include a laser 202 coupled to a first input port of the photonic circuit 105. A second input port (e.g., a bias signal port) of the photonic circuit 105 may be coupled to a signal line for a bias signal source. A third input port (e.g., a clock signal port) of the photonic circuit 105 may be coupled with a clock signal. An output port of the photonic circuit 105 may be coupled with an input port of the photonic circuit 205.

As described above in relation to FIG. 1A, the photonic circuit 105 may generate a photonic clock signal 210 using a photonic signal 204 emitted by the laser 202, a photonic seed clock signal 206 and a bias signal 208 provided to the set of input ports of the photonic circuit 105. The laser 202 may be a photonic device that operates in the same manner as the laser 102, the photonic seed clock signal 206 may be an embodiment of the photonic seed clock signal 108, and the bias signal 208 may be an embodiment of the bias signal 118. A rate of the photonic clock signal 210 generated at the output port of the photonic circuit 105 may be faster (e.g., approximately two times faster) than a rate of the photonic seed clock signal 206.

As noted, the input port of the photonic circuit 205 may be coupled to the output port of the photonic circuit 105, i.e., to the output port of the photonic combiner 136. The photonic circuit 205 may generate a photonic clock signal 228 using the photonic clock signal 210 generated by the photonic circuit 105. A rate of the photonic clock signal 228 may be faster (e.g., approximately two times faster) than a rate of the photonic clock signal 210.

The photonic circuit 205 may include a beam splitter 212, a delay circuit 218, a phase shifter 222 and a photonic combiner 226. An input port of the beam splitter 212 may be an input port for the photonic circuit 205 and couples with the output port of the photonic circuit 105. The beam splitter 212 has a first output port and a second output port. The first output port of the beam splitter 212 couples with an input port of the delay circuit 218. An output port of the delay circuit 218 couples with an input port of the phase shifter 222. An output port of the phase shifter 222 couples with a first input port of the photonic combiner 226. The second output port of the beam splitter 212 couples with a second input port of the photonic combiner 226. An output of the photonic combiner 226 provides an output of the photonic circuit 205, i.e., the photonic clock signal 228. It is noted that the input/output ports may be coupled through signal transmission lines (or signal lines). The photonic circuit 205 may include fewer or additional components not shown in FIG. 2A, such as, but not limited to, additional phase shifters for compensation of fabrication variations, inverse-designed devices, linear photonic amplifiers, photonic attenuators, photonic phase thresholders, and/or photonic amplitude thresholders.

The beam splitter 212 may receive the photonic clock signal 210 at its input port. The input port of the beam splitter 212 may represent, e.g., a waveguide, a waveguide polarization, a waveguide mode, a light wavelength, etc. The beam splitter 212 is a linear photonic component that splits the photonic clock signal 210 into two photonic clock signals 214 and 216. Each photonic clock signal 214 and 216 may be output at a respective output port of the beam splitter 212. A set of output ports of the beam splitter 212 may represent, e.g., a set of waveguides, a set of waveguide polarizations, a set of waveguide modes, a set of light wavelengths, signals radiated by the beam splitter 212, etc. The photonic clock signals 214 and 216 produced by the beam splitter 212 may be passed to the delay circuit 218 and the photonic combiner 226, respectively.

The delay circuit 218 may receive the photonic clock signal 214 at an input port of the delay circuit 218. The input port of the delay circuit 218 may represent, e.g., a waveguide, a waveguide polarization, a waveguide mode, a light wavelength, etc. The delay circuit 218 is a linear photonic component that generates a photonic clock signal 220 by delaying the photonic clock signal 214 by a defined time period (e.g., by the time delay of $\tau/4$). In one or more embodiments, the delay circuit 218 is implemented as, e.g., a long waveguide, long optical fiber, slow-light material, or photonic D-type flip-flop. The photonic clock signal 220 may be output at an output port of the delay circuit 218. The output port of the delay circuit 218 may represent, e.g., a waveguide, a waveguide polarization, a waveguide mode, a light wavelength, a signal radiated by the delay circuit 218, etc. The photonic clock signal 220 generated by the delay circuit 218 may be passed to the phase shifter 222.

The phase shifter 222 may receive the photonic clock signal 220 at its input port. The input port of the phase shifter 222 may represent, e.g., a waveguide, a waveguide polarization, a waveguide mode, a light wavelength, etc. The phase shifter 222 is a linear photonic component that generates a photonic clock signal 224 by shifting a phase of the received photonic clock signal 220. For example, the phase shifter 222 may apply a phase shift of $\pi$ radians to the photonic clock signal 220, i.e., the photonic clock signal 224 may represent an inverted version of the photonic clock signal 220. The photonic clock signal 224 may be output at an output port of the phase shifter 222. The output port of the phase shifter 222 may represent, e.g., a waveguide, a waveguide polarization, a waveguide mode, a light wavelength, a signal radiated by the phase shifter 222, etc. The photonic clock signal 224 generated by the phase shifter 222 may be passed to the photonic combiner 226.

The photonic combiner 226 may receive, at its first input port, the photonic clock signal 216 generated by the beam splitter 212. The photonic combiner 226 may further receive, at its second input port, the photonic clock signal 224 generated by the phase shifter 222. The set of input ports of the photonic combiner 226 may represent, e.g., a set of waveguides, a set of waveguide polarizations, a set of waveguide modes, a set of light wavelengths, etc. The photonic combiner 226 may generate the photonic clock signal 228 by combining the photonic clock signal 216 and the photonic clock signal 224. Thus, the photonic combiner 226 operates as a linear OR photonic logic gate. The photonic clock signal 228 may be output at an output port of the photonic combiner 226. The output port of the photonic combiner 226 may represent, e.g., a waveguide, a waveguide polarization, a waveguide mode, a light wavelength, a signal radiated by the photonic combiner 226, etc. The output port of the photonic combiner 226 may represent an output port of the photonic circuit 205.

In one or more embodiments, in order to provide the photonic clock signal 228 to the one or more photonic circuits, a photonic phase thresholder (and/or photonic amplitude thresholder) is required to correct phases and/or amplitude values of the photonic clock signal 228. Each of the photonic phase thresholder and the photonic amplitude thresholder may be based on a semiconductor optical amplifier operating in the saturation regime. Alternatively, an electro-optical thresholder may be utilized for correcting phases and/or amplitude values of the photonic clock signal 228. The electro-optical thresholder may be designed by cascading photodetectors, transimpedance amplifiers, drivers, and photonic modulators. Alternatively, other types of thresholders can be used for correcting phases and/or amplitude values of the photonic clock signal 228.

FIG. 2B illustrates an example graph 250 of the photonic seed clock signal 206 that is input to the photonic circuit 105 and the photonic clock signal 228 that is generated by a cascading connection of the photonic circuit 105 and the photonic circuit 205, in accordance with some embodiments. Note that a rate of the photonic clock signal 228 is faster (e.g., approximately four times faster) than a rate of the photonic seed clock signal 206 that is input to the photonic circuit 105. For example, the rate of the photonic seed clock signal 206 may be approximately 50 Gbps, and the rate of the photonic clock signal 228 may be approximately 200 Gbps. Thus, the cascading connection of the photonic circuit 105 and the photonic circuit 205 may effectively operate as a photonic bit rate multiplier. Note also that the photonic clock signal 228 may feature one or more wavelengths originating from the photonic signal 204 generated by the laser 202. In one or more embodiments, the photonic circuit 105 and/or the photonic circuit 205 include one or more photonic amplifiers for generating the photonic clock signal 228 having amplitudes of one or more desired levels. The photonic circuit 105 and/or the photonic circuit 205 with the one or more photonic amplifiers may be configured to generate the photonic clock signal 228 having a signal-to-noise ratio that is above a threshold level. The photonic clock signal 228 generated by the cascading connection of the photonic circuit 105 and the photonic circuit 205 may be provided as a clock signal to one or more photonic circuits of a photonic processor.

Figure 3:
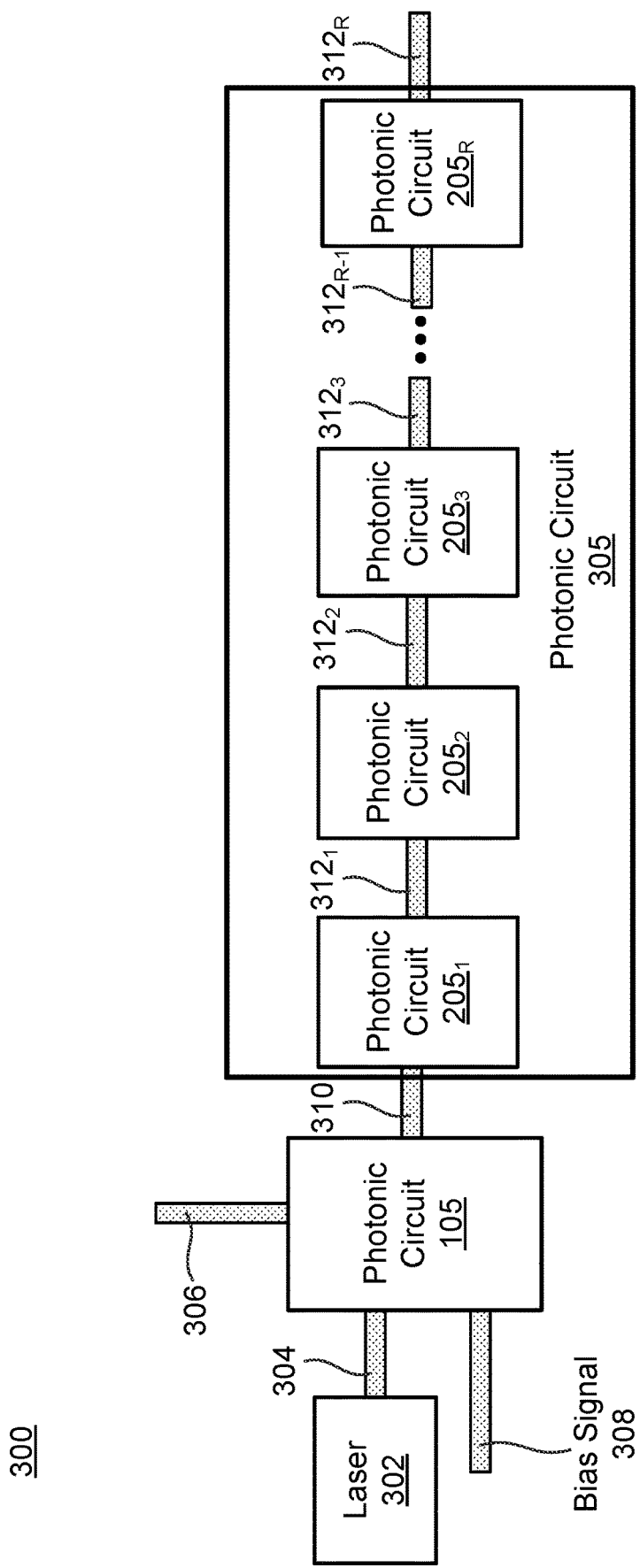
FIG. 3 illustrates an example photonic system for generating a multiple photonic ultrafast clock signal, in accordance with some embodiments.

FIG. 3 illustrates an example photonic system 300 with the photonic circuit 105 coupled to a photonic circuit 305 for generating a photonic ultrafast clock signal, in accordance with some embodiments. In addition to the photonic circuit 105 and the photonic circuit 305, the photonic system 300 may further include a laser 302 coupled to the photonic circuit 105. An output of the laser 302 couples with a first input port of the photonic circuit 105. A second input port (e.g., a bias signal port) of the photonic circuit 105 may be coupled to a signal line for a bias signal source. A third input port (e.g., a clock signal port) of the photonic circuit 105 may be coupled with a photonic seed clock signal 306. An output port of the photonic circuit 105 may be coupled with an input port of the photonic circuit 305. It is noted that the input/output ports may be coupled through signal transmission lines (or signal lines).

The photonic circuit 305 may include a cascading connection of a plurality of photonic circuits $205_1$, $205_2$, $205_3$, . . . , $205_R$, where R≥1. An input port of the first photonic circuit $205_1$ may be an input port for the photonic circuit 305 and an output port of the last photonic circuit $205_R$ may be an output port for the photonic circuit 305. In between, an input port of a current stage photonic circuit $205_X$ couples with an output port of a prior stage photonic circuit $205_{X-1}$, and an output port of the current stage photonic circuit $205_X$ couples with an input port of the next stage photonic circuit $205_{X+1}$, where the photonic circuit $205_X$ refers to a specific photonic circuit between the first photonic circuit (which may be $205_{X-1}$) and the last photonic circuit (which may be $205_{X+1}$).

As described above in relation to FIG. 1A and FIG. 2A, the photonic circuit 105 may generate a photonic clock signal 310 using a photonic signal 304 emitted by the laser 302, a photonic seed clock signal 306 and a bias signal 308 provided to the set of input ports of the photonic circuit 105. The laser 302 may be a photonic device that operates in the same manner as the laser 102 and the laser 202; the photonic seed clock signal 306 may be an embodiment of the photonic seed clock signal 108 and an embodiment of the photonic seed clock signal 206; and the bias signal 308 may be an embodiment of the bias signal 118 and an embodiment of the bias signal 208. A rate of the photonic clock signal 310 generated at the output port of the photonic circuit 105 may be faster (e.g., approximately two times faster) than a rate of the photonic seed clock signal 306.

The photonic circuit $205_1$ may be coupled to an output port of the photonic circuit 105, i.e., the output port of the photonic combiner 136. The photonic circuit $205_1$ may be an embodiment of the photonic circuit 205, and the photonic circuit $205_1$ may operate in the same manner as the photonic circuit 205. Thus, the photonic circuit $205_1$ may generate a photonic clock signal $312_1$ based on the photonic clock signal 310, and a rate of the photonic clock signal $312_1$ may be faster (e.g., approximately two times faster) than a rate of the photonic clock signal 310 that is input to the photonic circuit $205_1$. The photonic clock signal $312_1$ and the photonic clock signal 228 may represent the same photonic clock signals. The photonic clock signal $312_1$ may be output at an output port of the photonic circuit $205_1$ (i.e., at an output port of the photonic combiner 226 of the photonic circuit $205_1$). The photonic clock signal $312_1$ generated by the cascading connection of the photonic circuit 105 and the photonic circuit $205_1$ may be provided as a clock signal to one or more photonic circuits of a photonic processor. Additionally, the photonic clock signal $312_1$ may be provided to the photonic circuit $205_2$.

In one or more embodiments, in order to provide the photonic clock signal $312_1$ to the one or more photonic circuits, a photonic phase thresholder (and/or photonic amplitude thresholder) is required to correct phases and/or amplitude values of the photonic clock signal $312_1$. Each of the photonic phase thresholder and the photonic amplitude thresholder may be based on a semiconductor optical amplifier operating in the saturation regime. Alternatively, an electro-optical thresholder may be utilized for correcting phases and/or amplitude values of the photonic clock signal $312_1$. The electro-optical thresholder may be designed by cascading photodetectors, transimpedance amplifiers, drivers, and photonic modulators. Alternatively, other types of thresholders can be used for correcting phases and/or amplitude values of the photonic clock signal $312_1$.

The photonic circuit $205_2$ may receive the photonic clock signal $312_1$ at an input port of the photonic circuit $205_2$. The input port of the photonic circuit $205_2$ may be an input port of the beam splitter 212 of the photonic circuit $205_2$. The photonic circuit $205_2$ may be an embodiment of the photonic circuit 205, and the photonic circuit $205_2$ may operate in the same manner as the photonic circuit 205, except that the delay circuit 218 of the photonic circuit $205_2$ applies a delay that is one half of a delay applied by the delay circuit 218 of the photonic circuits 205 and $205_1$ (e.g., the time delay of τ/8).

The photonic circuit $205_2$ may generate a photonic clock signal $312_2$ based on the photonic clock signal $312_1$, and a rate of the photonic clock signal $312_2$ may be faster (e.g., approximately two times faster) than a rate of the photonic clock signal $312_1$ that is input to the photonic circuit $205_2$. For example, the rate of the photonic seed clock signal 306 may be approximately 50 Gbps, and the rate of the photonic clock signal $312_2$ may be approximately 400 Gbps. Thus, the cascading connection of the photonic circuit 105 and the photonic circuits $205_1$, $205_2$ may effectively operate as a photonic bit rate multiplier. Note also that the photonic clock signal $312_2$ may feature one or more wavelengths originating from the photonic signal 304 generated by the laser 302. The photonic clock signal $312_2$ may be output at an output port of the photonic circuit $205_2$ (i.e., at an output port of the photonic combiner 226 of the photonic circuit $205_2$). In one or more embodiments, the photonic circuit 105 and/or one or more of the photonic circuits $205_1$, $205_2$ include one or more photonic amplifiers for generating the photonic clock signal $312_2$ having amplitudes of one or more desired levels. The photonic circuit 105 and/or the one or more of the photonic circuits $205_1$, $205_2$ with the one or more photonic amplifiers may be configured to generate the photonic clock signal $312_2$ having a signal-to-noise ratio that is above a threshold level. The photonic clock signal $312_2$ generated by the cascading connection of the photonic circuit 105 and the photonic circuits $205_1$, $205_2$ may be provided as a clock signal to one or more photonic circuits of a photonic processor. Alternatively or additionally, the photonic clock signal $312_2$ may be provided to the photonic circuit $205_3$.

In one or more embodiments, in order to provide the photonic clock signal $312_2$ to the one or more photonic circuits, a photonic phase thresholder (and/or photonic amplitude thresholder) is required to correct phases and/or amplitude values of the photonic clock signal $312_2$. Each of the photonic phase thresholder and the photonic amplitude thresholder may be based on a semiconductor optical amplifier operating in the saturation regime. Alternatively, an electro-optical thresholder may be utilized for correcting phases and/or amplitude values of the photonic clock signal $312_2$. The electro-optical thresholder may be designed by cascading photodetectors, transimpedance amplifiers, drivers, and photonic modulators. Alternatively, other types of thresholders can be used for correcting phases and/or amplitude values of the photonic clock signal $312_2$.

The photonic circuit $205_3$ may receive the photonic clock signal $312_2$ at an input port of the photonic circuit $205_3$. The input port of the photonic circuit $205_3$ may be an input port of the beam splitter 212 of the photonic circuit $205_3$. The photonic circuit $205_3$ may be an embodiment of the photonic circuit 205, and the photonic circuit $205_3$ may operate in the same manner as the photonic circuit 205, except that the delay circuit 218 of the photonic circuit $205_3$ applies a delay that is one fourth of a delay applied by the delay circuit 218 of the photonic circuits 205 and $205_1$ (e.g., the time delay of τ/16).

The photonic circuit $205_3$ may generate a photonic clock signal $312_3$ based on the photonic clock signal $312_2$, and a rate of the photonic clock signal $312_3$ may be faster (e.g., approximately two times faster) than a rate of the photonic clock signal $312_2$ that is input to the photonic circuit $205_3$. For example, the rate of the photonic seed clock signal 306 may be approximately 50 Gbps, and the rate of the photonic clock signal $312_3$ may be approximately 800 Gbps. Thus, the cascading connection of the photonic circuit 105 and the photonic circuits $205_1$, $205_2$, $205_3$ may effectively operate as a photonic bit rate multiplier. Note also that the photonic clock signal $312_3$ may feature one or more wavelengths originating from the photonic signal 304 generated by the laser 302. The photonic clock signal $312_3$ may be output at an output port of the photonic circuit $205_3$ (i.e., at an output port of the photonic combiner 226 of the photonic circuit $205_3$). In one or more embodiments, the photonic circuit 105 and/or one or more of the photonic circuits $205_1$, $205_2$, $205_3$ include one or more photonic amplifiers for generating the photonic clock signal $312_3$ having amplitudes of one or more desired levels. The photonic circuit 105 and/or the one or more of the photonic circuits $205_1$, $205_2$, $205_3$ with the one or more photonic amplifiers may be configured to generate the photonic clock signal $312_3$ having a signal-to-noise ratio that is above a threshold level. The photonic clock signal $312_3$ generated by the cascading connection of the photonic circuit 105 and the photonic circuits $205_1$, $205_2$, $205_3$ may be directly provided as a clock signal to one or more photonic circuits of a photonic processor. Alternatively, or additionally, the photonic clock signal $312_3$ may be provided to the photonic circuit $205_4$ (not explicitly shown in FIG. 3).

In one or more embodiments, in order to provide the photonic clock signal $312_3$ to the one or more photonic circuits, a photonic phase thresholder (and/or photonic amplitude thresholder) is required to correct phases and/or amplitude values of the photonic clock signal $312_3$. Each of the photonic phase thresholder and the photonic amplitude thresholder may be based on a semiconductor optical amplifier operating in the saturation regime. Alternatively, an electro-optical thresholder may be utilized for correcting phases and/or amplitude values of the photonic clock signal $312_3$. The electro-optical thresholder may be designed by cascading photodetectors, transimpedance amplifiers, drivers, and photonic modulators. Alternatively, other types of thresholders can be used for correcting phases and/or amplitude values of the photonic clock signal $312_3$.

The photonic circuit $205_R$ may be the R-th and the last of photonic circuits in the cascading connection of the plurality photonic circuits $205_1$, $205_2$, $205_3$, . . . , $205_R$ within the photonic circuit 305. The photonic circuit $205_R$ may receive at its input port a photonic clock signal $312_{R-1}$ that was generated by the photonic circuit $205_{R-1}$. The input port of the photonic circuit $205_R$ may be an input port of the beam splitter 212 of the photonic circuit $205_R$. The photonic circuit $205_R$ may be an embodiment of the photonic circuit 205, and the photonic circuit $205_R$ may operate in the same manner as the photonic circuit 205, except that the delay circuit 218 of the photonic circuit $205_R$ applies a smaller delay than a delay applied by the delay circuit 218 in any of the photonic circuits $205_1$, $205_2$, $205_3$, . . . , $205_{R-1}$ (e.g., the time delay of τ/N, where $N=2^{R+1}$).

The photonic circuit $205_R$ may generate a photonic clock signal $312_R$ based on the photonic clock signal $312_{R-1}$, and a rate of the photonic clock signal $312_R$ may be faster (e.g., approximately two times faster) than a rate of the photonic clock signal $312_{R-1}$ that is input to the photonic circuit $205_3$. In general, the rate of the photonic clock signal $312_R$ generated by the photonic circuit $205_R$ may be N times faster than the rate of the photonic seed clock signal 306 that is input to the photonic circuit 105, where $N=2^{R+1}$. For example, the rate of the photonic seed clock signal 306 may be approximately 50 Gbps, and the rate of the photonic clock signal $312_R$ may be approximately 1600 Gbps, i.e., the rate of the photonic clock signal $312_R$ may be N=32 times faster than the rate of the photonic seed clock signal 306. Thus, the cascading connection of the photonic circuit 105 and the photonic circuit 305 with the plurality of photonic circuits $205_1$, $205_2$, $205_3$, ..., $205_R$ may effectively operate as a photonic bit rate multiplier. Note also that the photonic clock signal $312_R$ may feature one or more wavelengths originating from the photonic signal 304 generated by the laser 302. The photonic clock signal $312_R$ may be output at an output port of the photonic circuit $205_R$ (i.e., at an output port of the photonic combiner 226 of the photonic circuit $205_R$). In one or more embodiments, the photonic circuit 105 and/or one or more of the photonic circuits $205_1$, $205_2$, $205_3$, ..., $205_R$ include one or more photonic amplifiers for generating the photonic clock signal $312_R$ having amplitudes of one or more desired levels. The photonic circuit 105 and/or the one or more of the photonic circuits $205_1$, $205_2$, $205_3$, ..., $205_R$ with the one or more photonic amplifiers may be configured to generate the photonic clock signal $312_R$ having a signal-to-noise ratio that is above a threshold level. The photonic clock signal $312_R$ generated by the cascading connection of the photonic circuit 105 and the photonic circuits $205_1$, $205_2$, $205_3$, ..., $205_R$ may be provided as a clock signal to one or more photonic circuits of a photonic processor.

In one or more embodiments, in order to provide the photonic clock signal $312_R$ to the one or more photonic circuits, a photonic phase thresholder (and/or photonic amplitude thresholder) is required to correct phases and/or amplitude values of the photonic clock signal $312_R$. Each of the photonic phase thresholder and the photonic amplitude thresholder may be based on a semiconductor optical amplifier operating in the saturation regime. Alternatively, an electro-optical thresholder may be utilized for correcting phases and/or amplitude values of the photonic clock signal $312_R$. The electro-optical thresholder may be designed by cascading photodetectors, transimpedance amplifiers, drivers, and photonic modulators. Alternatively, other types of thresholders can be used for correcting phases and/or amplitude values of the photonic clock signal $312_R$.

Example Process Flow

FIG. 4 is a flowchart illustrating an example method 400 for operating a photonic circuit to generate a photonic ultrafast clock signal, in accordance with some embodiments. The operations of method 400 may be performed at, e.g., the photonic circuit 105, the photonic circuit 205, and/or the photonic circuit 305. The photonic circuit may be part of a photonic processor. Alternatively, the photonic circuit may be a photonic device separate from the photonic processor. The photonic circuit may be deployed in a computing system that further includes a non-transitory computer-readable storage medium (e.g., optical, electrical, or electro-optical memory) for storing computer-executable instructions and data. The computing system may be an optical computing system (i.e., silicon photonics platform), an electronic computing system, some other type of computing system, or some combination thereof.

The photonic circuit splits 405, by a beam splitter (e.g., the beam splitter 112), a photonic seed clock signal into a first photonic seed clock signal and a second photonic seed clock signal. The photonic circuit may receive, at a photonic modulator (e.g., the photonic modulator 106), a light signal generated by a laser coupled to the at least one input of the photonic modulator. The photonic modulator may generate the photonic seed clock signal by modulating the received light signal and output the photonic seed clock signal at an output of the photonic modulator coupled to the at least one input of the beam splitter.

The photonic circuit shifts 410, by a phase shifter (e.g., the phase shifter 120), a phase of a photonic signal to generate a phase-shifted version of the photonic signal. A bias signal (e.g., the bias signal 118, the bias signal 208 or the bias signal 308) may be input to the phase shifter as the photonic signal of a defined amplitude value that is constant over time. The photonic circuit combines 415, by a first photonic combiner (e.g., the photonic combiner 126), the second photonic seed clock signal with the phase-shifted version of the photonic signal to generate a first combined photonic signal. The photonic circuit combines 420, by a second photonic combiner (e.g., the photonic combiner 136), a delayed and attenuated version of the first photonic seed clock signal with the first combined photonic signal to generate a photonic clock signal (e.g., the photonic clock signal 138, the photonic clock signal 210 or the photonic clock signal 310). A rate of the photonic clock signal may be two times faster than a rate of the photonic seed clock signal. The photonic clock signal generated by the photonic circuit may be provides as a clock signal to the photonic processor.

The photonic circuit may further include a cascading connection of a photonic delay circuit and a photonic attenuator (e.g., the delay circuit 124 and the photonic attenuator 132) coupled to the beam splitter and the second photonic combiner. The cascading connection of the photonic delay circuit and the photonic attenuator may be configured to receive the first photonic seed clock signal from the beam splitter, generate the delayed and attenuated version of the first photonic seed clock signal by delaying and attenuating the received first photonic seed clock signal and provide the delayed and attenuated version of first photonic seed clock signal to the second photonic combiner. An input of the photonic delay circuit may be coupled to the first output of the beam splitter, and an output of the photonic delay circuit may be coupled to an input of the photonic attenuator. A first input of the first photonic combiner may be coupled to the second output of the beam splitter, and a second input of the first photonic combiner may be coupled to the output of the phase shifter. The second photonic combiner may be coupled to an output of the photonic attenuator and the output of the first photonic combiner.

The photonic circuit may further include a cascading photonic circuit (e.g., the photonic circuit 205, or one or more of the photonic circuits $205_1$, $205_2$, ..., $205_R$) coupled to an output of the second photonic combiner. The cascading photonic circuit may receive the photonic clock signal from the output of the second photonic combiner and generate a second photonic clock signal (e.g., the photonic clock signal 228, the photonic clock signal $312_1$, the photonic clock signal $312_2$, ..., or the photonic signal $312_R$) based on the received photonic clock signal. A rate of the second photonic clock signal may be faster (e.g., at least four times faster) than a rate of the photonic clock signal. The photonic circuit may further include one or more photonic amplifiers coupled to the cascading photonic circuit, wherein the one or more photonic amplifiers and the cascading photonic circuit may be configured to generate the second photonic clock signal having a signal-to-noise ratio that is above a threshold level.

In one or more embodiments, the cascading photonic circuit includes a cascading connection of a second beam splitter (e.g., the beam splitter 212), a photonic delay circuit (e.g., the delay circuit 218), a second phase shifter (e.g., the phase shifter 222) and a third photonic combiner (e.g., the photonic combiner 226). An input of the second beam splitter may be coupled to the output of the second photonic combiner. An input of the photonic delay circuit may be coupled to a first output of the second beam splitter, and an output of the photonic delay circuit may be coupled to an input of the second phase shifter. The third photonic combiner may be coupled to an output of the second phase shifter and a second output of the second beam splitter.

In one or more other embodiments, the cascading photonic circuit includes a plurality of cascading connections (e.g., the photonic circuits $205_1, 205_2, \ldots, 205_R$), each of the plurality of cascading connections including a respective beam splitter (e.g., the beam splitter 212), a respective photonic delay circuit (e.g., the delay circuit 218), a respective phase shifter (e.g., the phase shifter 222) and a respective photonic combiner (e.g., the photonic combiner 226). An input of the respective photonic delay circuit may be coupled to a first output of the respective beam splitter, an output of the respective photonic delay circuit may be coupled to an input of the respective phase shifter, and the respective photonic combiner may be coupled to an output of the respective phase shifter and a second output of the respective beam splitter.

This disclosure presents photonic circuits that generate ultrafast photonic clock signals of various rates. The photonic circuits presented herein represent scalable solutions for generating photonic clock signals of different rates for various photonic devices. The generated photonic clock signals feature substantially higher rates than an input photonic seed clock signal, making these ultrafast photonic clock signals suitable for running different high-speed algorithms executed at photonic processors. In one or more embodiments, in order to provide each generated photonic clock signal to different photonic devices, a photonic phase thresholder (and/or photonic amplitude thresholder) is required to correct phases and/or amplitude values of each generated photonic clock signal. Each of the photonic phase thresholder and the photonic amplitude thresholder may be based on a semiconductor optical amplifier operating in the saturation regime. Alternatively, an electro-optical thresholder may be utilized for correcting phases and/or amplitude values of each generated photonic clock signal. The electro-optical thresholder may be designed by cascading photodetectors, transimpedance amplifiers, drivers, and photonic modulators. Alternatively, other types of thresholders can be used for correcting phases and/or amplitude values of each generated photonic clock signal.

Additional Considerations

The disclosed configurations beneficially provide for efficient design of photonic logic gates while substantially reducing a number of required numerical design simulations.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to effectively convey the substance of their work to others skilled in the art. While described functionally, computationally, or logically, these operations are understood to be implemented by computer programs or equivalent electrical circuits, microcode, or the like. Furthermore, at times, it has also proven convenient to refer to these arrangements of operations as modules without loss of generality. The described operations and associated modules can be embodied in software, firmware, hardware, or some combination thereof.

Any steps, operations, or processes described herein can be performed or implemented with one or more hardware or software modules, alone or in combination with other devices. In one embodiment, a software module is implemented with a computer program product comprising a computer-readable medium containing computer program code, which a computer processor can execute for performing any or all of the steps, operations, or processes described herein.

Embodiments of the disclosure can also relate to an apparatus for performing the operations herein. This apparatus can be specially constructed for the required purposes, and/or it can comprise a general-purpose computing device selectively activated or reconfigured by a computer program stored in the computer. Such a computer program can be stored in a non-transitory, tangible computer-readable storage medium or any media suitable for storing electrical instructions coupled to a computer system bus. Furthermore, any computing systems referred to in the specification can include a single processor or architectures employing multiple processor designs for increased computing capability.

Some embodiments of the present disclosure can further relate to a system comprising a processor, at least one computer processor, and a non-transitory computer-readable storage medium. The storage medium can store computer-executable instructions, which, when executed by the compiler operating on at least one computer processor, cause at least one computer processor to be operable for performing the operations and techniques described herein.

Finally, the language used in the specification has been principally selected for readability and instructional purposes, and it has not been selected to delineate or circumscribe the inventive subject matter. It is therefore intended that the scope of the disclosure be limited not by this detailed description but rather by any claims that issue on an application based hereon. Accordingly, the disclosure of the embodiments is intended to be illustrative, but not to limit the scope of the disclosure, which is set forth in the following claims.

What is claimed is:

1. A photonic circuit, comprising:
a beam splitter having at least one input to receive a photonic seed clock signal, the beam splitter configured to split the photonic seed clock signal into a first photonic seed clock signal and a second photonic seed clock signal;
a phase shifter having at least one input to receive a photonic signal, the phase shifter configured to shift a phase of the received photonic signal to generate a phase-shifted version of the photonic signal;
a first photonic combiner having a first set of one or more inputs, a first input of the first set of one or more inputs coupled to a first output of the beam splitter, a second input of the first set of one or more inputs coupled to an output of the phase shifter, the first photonic combiner configured to combine the second photonic seed clock signal with the phase-shifted version of the photonic signal to generate a first combined photonic signal; and
a second photonic combiner having a second set of one or more inputs, a first input of the second set of one or more inputs coupled to a second output of the beam splitter, a second input of the second set of one or more inputs coupled to an output of the first photonic combiner, the second photonic combiner configured to combine a delayed and attenuated version of the first photonic seed clock signal with the first combined photonic signal to generate a photonic clock signal.

2. The photonic circuit of claim 1, further comprising a photonic modulator having at least one input to receive a light signal generated by a laser coupled to the at least one input of the photonic modulator, the photonic modulator configured to:
generate the photonic seed clock signal by modulating the received light signal; and
output the photonic seed clock signal at an output of the photonic modulator coupled to the at least one input of the beam splitter.

3. The photonic circuit of claim 1, further comprising a cascading connection of a photonic delay circuit and a photonic attenuator coupled to the beam splitter and the second photonic combiner, the cascading connection of the photonic delay circuit and the photonic attenuator configured to:
receive the first photonic seed clock signal from the beam splitter;
generate the delayed and attenuated version of the first photonic seed clock signal by delaying and attenuating the received first photonic seed clock signal; and
provide the delayed and attenuated version of first photonic seed clock signal to the second photonic combiner.

4. The photonic circuit of claim 3, wherein:
an input of the photonic delay circuit is coupled to the second output of the beam splitter;
an output of the photonic delay circuit is coupled to an input of the photonic attenuator;
the first input of the first photonic combiner is coupled to the first output of the beam splitter;
the second input of the first photonic combiner is coupled to the output of the phase shifter;
the first input of the second photonic combiner is coupled to an output of the photonic attenuator; and
the second input of the second photonic combiner is coupled to the output of the first photonic combiner.

5. The photonic circuit of claim 1, further comprising a bias signal input to the phase shifter as the photonic signal of a defined amplitude value that is constant over time.

6. The photonic circuit of claim 1, wherein a rate of the photonic clock signal is two times faster than a rate of the photonic seed clock signal.

7. The photonic circuit of claim 1, further comprising a cascading photonic circuit coupled to an output of the second photonic combiner, the cascading photonic circuit configured to:
receive the photonic clock signal from the output of the second photonic combiner; and
generate a second photonic clock signal based on the received photonic clock signal, a rate of the second photonic clock signal being faster than a rate of the photonic clock signal.

8. The photonic circuit of claim 7, wherein the cascading photonic circuit comprises a cascading connection of a second beam splitter, a photonic delay circuit, a second phase shifter and a third photonic combiner.

9. The photonic circuit of claim 8, wherein:
an input of the second beam splitter is coupled to the output of the second photonic combiner;
an input of the photonic delay circuit is coupled to a first output of the second beam splitter;
an output of the photonic delay circuit is coupled to an input of the second phase shifter; and the third photonic combiner is coupled to an output of the second phase shifter and a second output of the second beam splitter.

10. The photonic circuit of claim 7, wherein the rate of the second photonic clock signal is at least four times faster than a rate of the photonic seed clock signal.

11. The photonic circuit of claim 7, wherein the cascading photonic circuit comprises a plurality of cascading connections, each of the plurality of cascading connections including a respective beam splitter, a respective photonic delay circuit, a respective phase shifter and a respective photonic combiner.

12. The photonic circuit of claim 11, wherein:
an input of the respective photonic delay circuit is coupled to a first output of the respective beam splitter;
an output of the respective photonic delay circuit is coupled to an input of the respective phase shifter; and
the respective photonic combiner is coupled to an output of the respective phase shifter and a second output of the respective beam splitter.

13. The photonic circuit of claim 7, further comprising one or more photonic amplifiers coupled to the cascading photonic circuit, the one or more photonic amplifiers and the cascading photonic circuit configured to generate the second photonic clock signal having a signal-to-noise ratio that is above a threshold level.

14. The photonic circuit of claim 1, wherein the photonic circuit is part of a photonic processor having a clock signal based on the photonic clock signal.

15. A non-transitory computer-readable storage medium comprising stored instructions that, when executed by at least one processor, cause the at least one processor to:
instruct a beam splitter of a photonic circuit to receive a photonic seed clock signal and split the photonic seed clock signal into a first photonic seed clock signal and a second photonic seed clock signal;
instruct a phase shifter of the photonic circuit to receive a photonic signal and shift a phase of the photonic signal to generate a phase-shifted version of the photonic signal;
instruct a first photonic combiner of the photonic circuit coupled to the beam splitter and the phase shifter to combine the second photonic seed clock signal with the phase-shifted version of the photonic signal to generate a first combined photonic signal; and
instruct a second photonic combiner of the photonic circuit coupled to the beam splitter and the first photonic combiner to combine a delayed and attenuated version of the first photonic seed clock signal with the first combined photonic signal to generate a photonic clock signal.

16. The computer-readable storage medium of claim 15, wherein the stored instructions comprise further stored instructions that, when executed, cause the at least one processor to instruct a cascading connection of a photonic delay circuit and a photonic attenuator in the photonic circuit coupled to the photonic beam splitter and the second photonic combiner to:
receive the first photonic seed clock signal from the photonic beam splitter;
generate the delayed and attenuated version of the first photonic seed clock signal by delaying and attenuating the received first photonic seed clock signal; and
provide the delayed and attenuated version of first photonic seed clock signal to the second photonic combiner.

17. The computer-readable storage medium of claim 15, wherein the stored instructions comprise further stored instructions that, when executed, cause the at least one processor to:
 set an amplitude of a bias signal to a defined amplitude value that is constant over time, wherein the bias signal is input to the phase shifter as the photonic signal.

18. The computer-readable storage medium of claim 15, wherein the stored instructions comprise further stored instructions that, when executed, cause the at least one processor to instruct a cascading photonic circuit in the photonic circuit coupled to an output of the second photonic combiner to:
 receive the photonic clock signal from the output of the second photonic combiner; and
 generate a second photonic clock signal based on the received photonic clock signal, a rate of the second photonic clock signal being faster than a rate of the photonic clock signal.

19. A method comprising:
 splitting, by a beam splitter of a photonic circuit, a photonic seed clock signal into a first photonic seed clock signal and a second photonic seed clock signal;
 shifting, by a phase shifter of the photonic circuit, a phase of a photonic signal to generate a phase-shifted version of the photonic signal;
 combining, by a first photonic combiner of the photonic circuit coupled to the beam splitter and the phase shifter, the second photonic seed clock signal with the phase-shifted version of the photonic signal to generate a first combined photonic signal; and
 combining, by a second photonic combiner of the photonic circuit coupled to the beam splitter and the first photonic combiner, a delayed and attenuated version of the first photonic seed clock signal with the first combined photonic signal to generate a photonic clock signal.

20. The method of claim 19, further comprising:
receiving, at a cascading photonic circuit coupled to an output of the second photonic combiner, the photonic clock signal; and
generating, by the cascading photonic circuit, a second photonic clock signal based on the received photonic clock signal, a rate of the second photonic clock signal being faster than a rate of the photonic clock signal.

\* \* \* \* \*